United States Patent [19]
Aton et al.

[11] Patent Number: 5,072,417
[45] Date of Patent: Dec. 10, 1991

[54] METHODS AND APPARATUS FOR SYNCHRONIZING THE TIME SCALES OF E-BEAM TEST EQUIPMENT

[75] Inventors: Tom J. Aton, Dallas; Steve L. Lusky, Plano, both of Tex.

[73] Assignee: Texas Instruments Incorporated, Dallas, Tex.

[21] Appl. No.: 502,356

[22] Filed: Mar. 30, 1990

[51] Int. Cl.⁵ ............... G01R 31/305; G05B 23/02; G01C 25/00
[52] U.S. Cl. .................... 364/579; 324/501; 324/158 P; 364/569; 364/571.01
[58] Field of Search ............ 364/579, 569, 571.01, 364/571.02, 486, 487; 324/501, 158 R, 158 P

[56] References Cited

U.S. PATENT DOCUMENTS

| | | | |
|---|---|---|---|
| 3,531,716 | 9/1970 | Tarui et al. | 324/501 |
| 4,827,437 | 5/1989 | Blanton | 364/579 X |
| 4,864,228 | 9/1989 | Richardson | 324/158 R |
| 4,928,278 | 5/1990 | Otsuji et al. | 364/579 X |

OTHER PUBLICATIONS

"Electron Beam Finds Memory Faults, Reconfigures Chips"; Electronics; May 19, 1981; John G. Posa.

Primary Examiner—Parshotam S. Lall
Assistant Examiner—E. J. Pipala
Attorney, Agent, or Firm—James C. Kesterson; James T. Comfort; Melvin Sharp

[57] ABSTRACT

A method is provided for synchronizing the time scale of a test device driver (12) with an e-beam tester. Test device driver (12) generates a test pattern which is applied to the functional inputs (18) of a device under test (16). A trigger and a synchronizing signal are generated with an identical time relationship to the test pattern. The trigger is applied to the trigger input of e-beam tester electronics and e-beam generator (38). The synchronizing signal is caused to appear on device under test (16). Using e-beam tester electronics and e-beam generator (38), waveforms are created of the synchronizing signal appearing on device under test (16) and test response signals also appearing thereon in response to application of the test pattern to functional inputs (18). The time relationship between the synchronizing signal and the test response signals can then be established through the waveforms.

21 Claims, 2 Drawing Sheets

METHODS AND APPARATUS FOR SYNCHRONIZING THE TIME SCALES OF E-BEAM TEST EQUIPMENT

TECHNICAL FIELD OF THE INVENTION

The present invention relates in general to e-beam testing and in particular to methods and apparatus for synchronizing the time scales of e-beam test equipment.

BACKGROUND OF THE INVENTION

A major use of e-beam testers is the stroboscopic extraction of voltage waveforms on integrated circuits. A pulsed beam of electrons is directed at a test pad connected to a selected node of the circuit to be tested. Excitation by the beam of electrons causes a number of electrons to be returned with an energy proportionate to the voltage signal appearing on the test pad at the instant the electrons strike it. The energy of the returned electrons can then be analyzed electronically and the voltage signal appearing on the test pad can be constructed.

A conventional test setup for stroboscopic e-beam testing is shown in FIG. 1. A test device driver 12 provides test pattern to the inputs of device 16 under test. The test pattern normally repeats in a loop. In this example, only four inputs A, B, C and D are shown; however, the number is variable depending on the needs of the user and the capabilities of the test equipment. The test device driver also creates a trigger with a specified time relationship with the signals being provided to the inputs of the device under test. The trigger normally is associated with the start of each new loop of the test pattern. The trigger is provided to the blanking mechanism of the e-beam tester electronics and e-beam generator 38 through a variable delay circuitry 30 to generate electron pulses 52.

The e-beam tester electronics and e-beam generator 38 are directed at a selected test pad on the device under test 16, upon which a test response signal will appear in response to the various test input signals applied to the inputs of the device. A delay is selected using the variable delay box such that the e-beam tester electronics and e-beam generator 38 will sample the signal appearing on the test pad at a selected period of time in relation to the trigger. In response to a series of events triggered by the trigger, the e-beam tester electronics and e-beam generator 38 sample the signal on the test pad for the time defined by the variable delay circuitry 30 by directing a pulsed beam of electrons 52 at the test pad and analyzing the returned electrons 54. This process is repeated for a preselected number test pattern loops such that a corresponding number of samples are taken. The variable delay is then stepped a number of times such that the signal appearing on the test pad is sampled at a number of points with differing time relations to the trigger. Thus, by defining time zero by the trigger, varying the delay, and sampling various points in time of the test response signal, a composite waveform of a time variable test response signal can be created.

A problem arises in that an uncertainty is introduced into the test by an "insertion delay" which adds to the overall delay between the output of the trigger from the test device driver, and the e-beam striking the test pad. This creates uncertainty as to where a test response signal stands in relation to the point in time defined by the trigger, normally the start of a loop (time zero). This insertion delay is in addition to the controlled delay supplied by the variable delay box, and is caused by random and unknown factors in the system. During the time between the issuance of the trigger by the test device driver and the e-beam striking the test sample, typically the trigger will be passed through trigger circuits, analog and/or digital delay generators, pulse forming and shaping circuitry, and uncalibrated lengths of cable. Some elements of the insertion delay may likely depend on such factors as trigger rate and the delay scan range.

Similarly, an insertion delay between the test device driver and the device under test may further add unknown delays into the system. The varying of the test setups used between different devices under test may vary, and this variation is usually difficult if not impossible to measure. In this case, if the insertion delay between the test device driver and the device under test is large enough, the electron pulse beam generated from a trigger at the beginning of the test pattern may arrive at the test pad before an expected signal arrives.

The circuit designer has a critical need to understand the timing relationships between the test pattern input to the device under test, the trigger which normally defines the start of a test pattern loop, and the test response signals appearing on the test pads. If variable and unknown delays modify the relationship between the trigger, and either the test pattern input to the device under test or the resulting signals appearing on the test pads, the circuit designer cannot fully appreciate the operation of the device under test. During the testing of the interior of a large and complex integrated circuit using a complex test pattern, the lack of knowledge of the insertion delays can lead to unnecessary confusion as to the meaning of the results.

The above testing artifacts have become more serious as circuit speeds have increased.

Thus, a need has arisen for a method of accounting for these insertion delays to better allow the circuit designer to understand the time relationship between the trigger defining the start of a test pattern loop and firing the e-beam tester, and the signals appearing on the test pads.

SUMMARY OF THE INVENTION

A method is provided for synchronizing the time scales of e-beam test equipment. A test device driver generates a synchronizing signal and a trigger with a preselected time relationship with a test pattern applied to the device under test. The trigger is applied to the trigger input of the e-beam tester while the synchronizing signal is applied to a synchronizing signal test pad on the device under test. A waveform of the synchronizing signal on the test pad is then made using conventional e-beam testing techniques. The time relationship between the trigger and the synchronizing signals can be established by comparing the two.

In a first preferred embodiment, the synchronizing signal test pad is coupled to a dedicated input of the device under test. In a second preferred embodiment, the synchronizing signal is applied to a selected device under test input, and switched, using the circuitry of the device under test, to the test pad.

By having the synchronizing signal appear on a test pad on the device under test, the circuit designer can readily determine the time relationship between the point in the test pattern defined by the synchronizing signal, usually the start of the test pattern (time zero)

and various test response signals. Any errors which can result from insertion delays of unknown origin in the test setup are taken into account. Further, the user may adjust the test equipment to "zero out" the various insertion delays.

BRIEF DESCRIPTION OF THE DRAWINGS

Further aspects of the invention and their advantages will be more completely understood by studying the detailed description below taken in conjunction with the appended drawings in which.

DETAILED DESCRIPTION OF THE INVENTION

The present invention provides methods and apparatus for synchronizing the time scale of a test device driver and an e-beam tester.

Figure 1:
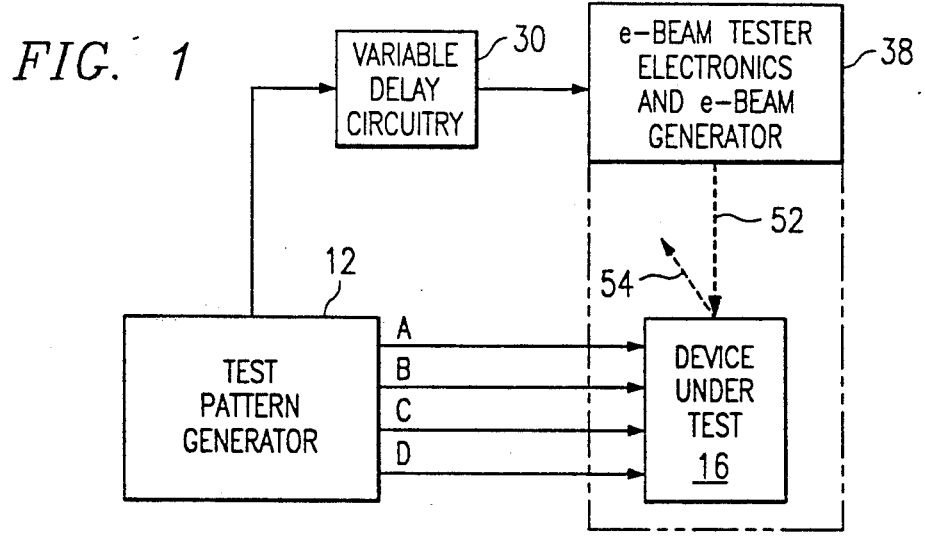
FIG. 1 depicts a functional block diagram of an e-beam test set-up according to the prior art.
Figure 2:
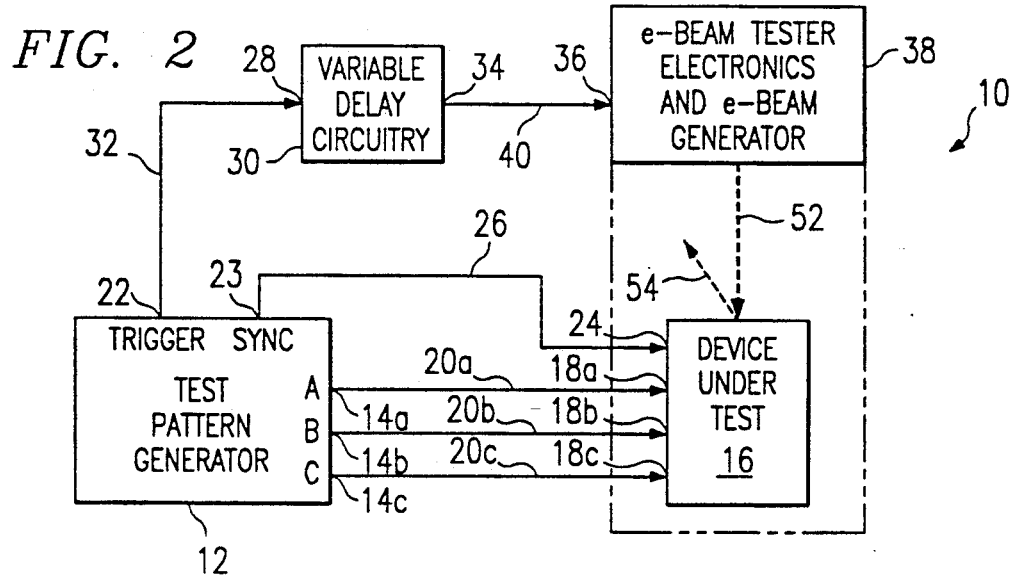
FIG. 2 depicts a functional block diagram of a portion of an e-beam test set-up according to the invention.

Referring to FIG. 2, an e-beam test setup is shown generally at 10. A test device driver 12 is shown provided with three test pattern outputs 14a-c. Three test pattern outputs are shown in FIG. 2 for convenience; during actual testing, however, the number of outputs actually employed will depend on the number of signals needed by the user and the number of ports available on the selected test device driver 12. A device under test 16 is shown with three corresponding functional inputs 18a-c. Again, the number of inputs to device under test 16 is variable depending on the test pattern being applied, and the number of inputs required by the device under test. Test device driver outputs 14a-c are shown connected to respective device inputs 18a-c by cables 20a-c.

Test device driver 12 is also shown with a trigger output 22 and a synchronizing output 23. Output 23 may be a dedicated output or a standard functional output similar to test pattern outputs 14a-c. Synchronizing output 23 is connected to a device input 24 by a cable 26. Cable 26 is selected to have substantially the same time delay as cables 20a-c. Trigger output 22 is connected to an input 28 of a variable delay circuitry 30 by a cable 32. An output 34 of variable delay circuitry 30 is connected to an input 36 to the blanking circuitry of an e-beam tester electronics and e-beam generator 38 by a cable 40. Variable delay circuitry 30 may be an integral part of e-beam tester electronics and e-beam generator 38, or a discrete component.

Figure 3:
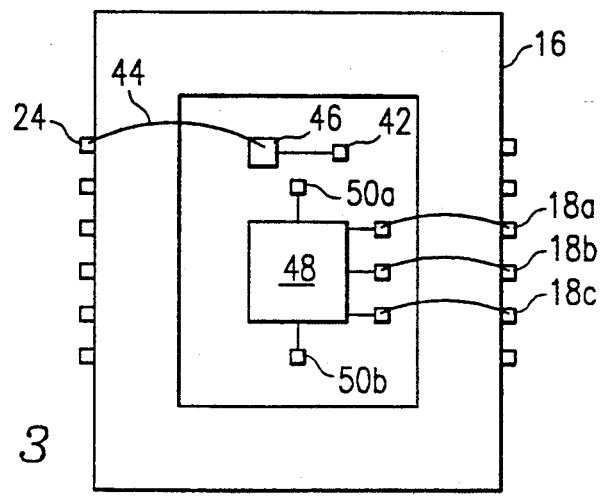
FIG. 3 depicts (a portion of) a device under test with a portion of a first preferred test set-up according to the invention located thereon.

FIG. 3 depicts a first preferred embodiment of the portion of the test setup on device 16 itself. Input 24 is connected to a synchronizing signal test pad 42 through a lead wire 44 and a bond pad 46. In this embodiment, input 24 is dedicated to receive a synchronizing signal during e-beam testing. During production of the device 16, lead wire 44 will normally not be connected. Inputs 18a-c are shown connected to the functioning circuitry of device 16. Two test pads 50a and 50b, tapping selected nodes of the circuitry 48, are indicated. The number of test pads 50 can vary from circuit to circuit depending on design.

Figure 4:
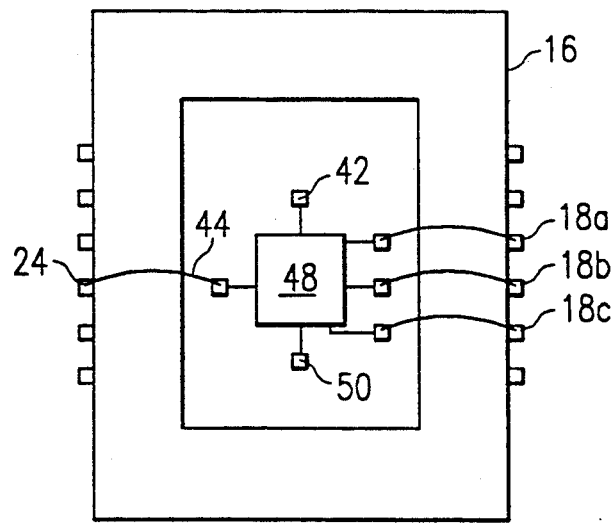
FIG. 4 depicts (a portion of) a device under test with a portion of a second preferred test set-up according to the invention located thereon.

FIG. 4 shows a second preferred embodiment of the test setup as it is disposed on device 16 itself. In this embodiment, trigger input 24 is not dedicated strictly to test, but represents an input carrying a functional input signal during actual use of the device. Input 24 is bonded by a permanent lead wire 44 to the functioning circuitry 48. Synchronizing signal test pad 42 is switchably connected to input 24 through operational circuitry 48.

One test pad 50 and three test pattern inputs 18a-c are shown as an example.

With a definition of the test setup connections now complete, a test method can now be described. Test generator 12 (FIG. 2) outputs a test pattern on output ports 14a-c. The test pattern, for example, may consist of digital pulse trains switching between zero and five volts when device 16 processes digital signals. The test pattern is applied to device 16 through input ports 18 such that test response signals appear on test pads 50 (FIGS. 3 or 4) in response to the device functioning. These test patterns are looped such that they repeatedly stimulate the device under test. For each test pattern loop, test device driver 12 (FIG. 2) outputs a trigger on trigger output 22 and a synchronizing signal on output 23. The trigger and the synchronizing signal are created simultaneously and are synchronized with the test pattern to define the start of each new test pattern loop.

Each trigger is passed through variable delay circuitry 30 to the input 36 to the blanking circuitry of e-beam tester electronics and e-beam generator 38, causing e-beam tester electronics and e-beam generator 38 to sample the signal appearing on a selected test pad 50 at the instant in time defined as the start of a test pattern loop plus the overall delay between test device driver 12 and e-beam generator. The overall delay consists of the insertion delays caused by the test equipment and test cables, as discussed above, and the delay programmed into variable delay circuitry 30. By stepping the variable delay and sampling, a waveform can be created of a complete set of test response signals appearing in response to the looped test pattern. A preselected number of samples are taken at each delay step.

To establish the time relationship between the waveform created for the test response signals appearing on test pads 50 and time zero, a waveform of the synchronizing signal is taken. The synchronizing signal is applied to device under test input 24 through cable 26 concurrently with the application of the trigger to variable delay circuitry 30. Using one of the two preferred set ups discussed above, the synchronizing signal is passed to a test pad 42. E-beam tester electronics and e-beam generator 38 can then step and sample the signal appearing on test pad 42 and measure its waveform. The user can then compare the waveform of the synchronizing signal with the waveforms of the test response signals. Since the synchronizing signal and the trigger are synchronized with the test pattern loop to define the start of a test pattern loop, the user can determine the relationship of various portions of the test response signals appearing on test pad 50 against the start of a test pattern loop.

Figure 5:
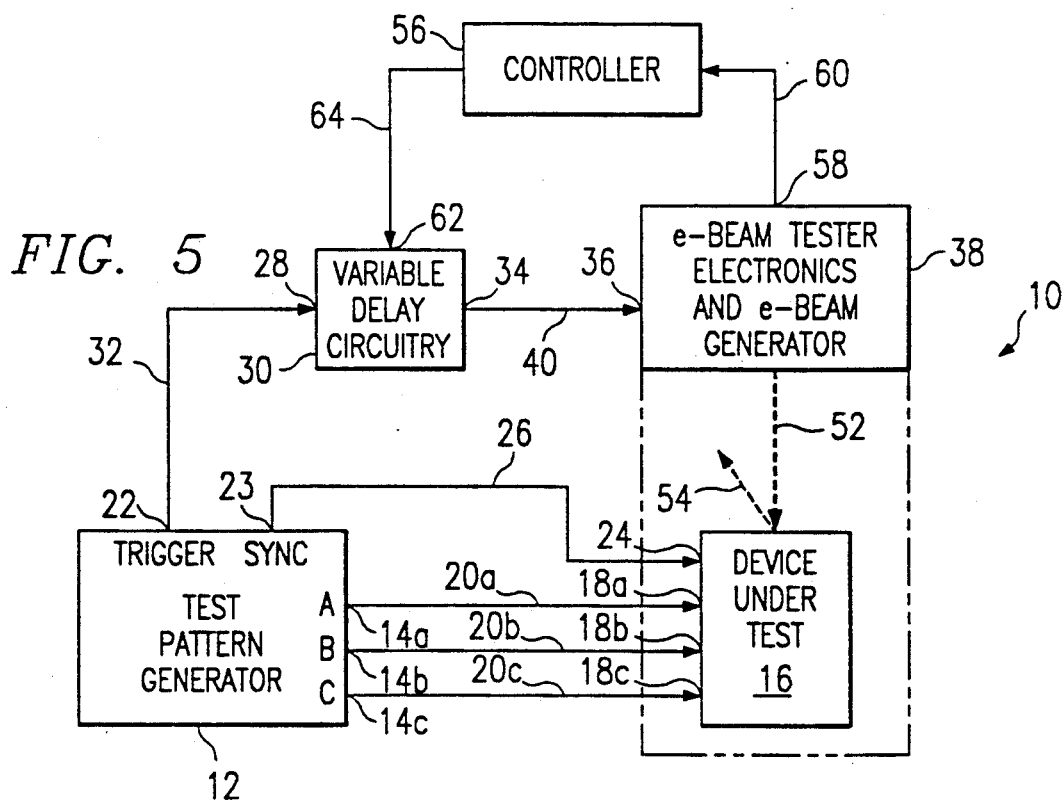
FIG. 5 depicts a functional block diagram of an embodiment of an e-beam test set-up according to the invention with an added controller for automatic operation.

FIG. 5 depicts a preferred embodiment with a controller 56 added for automatically compensating for insertion delays. Controller 56 is connected to an output 58 of e-beam electronics and e-beam generator 38 by a cable 60. Controller 56 is also connected to a control input 62 of variable delay circuitry 30 by a cable 64. The e-beam tester electronics and e-beam generator 38 extract a waveform of the synchronizing signal appearing on test pad 46 and pass the waveform to controller 56. Controller 56 automatically calculates the delay in the synchronizing signal by comparing the waveform with the trigger applied to input 36 to the blanking circuitry of e-beam tester electronics and e-beam generator 38. Controller 56 can then "zero out" the insertion delays by passing an analog or digital control signal to variable delay circuitry 30.

While a preferred embodiment of the invention and its advantages have been set forth in the above detailed description, the invention is not limited thereto, but only by the scope and spirit of the appended claims.

What is claimed is:

1. A method for synchronizing the time scale of a test device driver with an e-beam tester, comprising the steps of:
   generating a trigger having a preselected time relationship with a test pattern to be applied to a device under test;
   generating a synchronizing signal with substantially the same time relationship to the test pattern as the trigger;
   applying the trigger to a trigger input of the e-beam tester;
   causing the synchronizing signal to appear on the device under test;
   measuring a waveform of the synchronizing signal appearing on the device under test using the e-beam tester; and
   in response to said step of measuring the waveform, determining the time relationship between the synchronizing signal appearing on the device under test and the trigger input to the e-beam tester.

2. The method of claim 1, wherein the trigger and the synchronizing signal are generated at the start of the test pattern.

3. The method of claim 2, wherein the trigger and the synchronizing signal are generated by the test device driver.

4. The method of claim 1, wherein said step of causing the synchronizing signal to appear on the device under test comprises the sub-steps of:
   forming a synchronizing signal test pad on the device under test;
   connecting the synchronizing signal test pad to a dedicated input of said device under test; and
   applying the synchronizing signal to the synchronizing signal test pad through the dedicated connector.

5. The method of claim 1, wherein said step of causing the synchronizing signal to appear on the device under test comprises the sub-steps of:
   forming a test pad on the device under test;
   forming a switchable connection between the test pad and a selected input of the device under test;
   switching the selected input to the synchronizing signal test pad; and
   applying the synchronizing signal to the synchronizing signal test pad through the selected input.

6. The method of claim 5, wherein said switchable connection is made through the functional circuitry of said device under test.

7. The method of claim 1, wherein said step of creating a waveform of the synchronizing signal comprises the sub-steps of:
   bombarding the synchronizing signal test pad with a beam of electrons;
   measuring the energy of the returned electrons; and
   in response to said steps of bombarding and measuring, creating a waveform corresponding to synchronizing signal appearing on the synchronizing signal test pad.

8. A method for establishing the time relationship between a trigger and test response signals appearing on a device under test, comprising the steps of:
   generating at least one test pattern loop having a starting point;
   generating a trigger at the starting point of each loop;
   generating a synchronizing signal concurrently with the step of generating the trigger;
   applying the test pattern loop to a functional input of the device under test;
   applying the trigger to the trigger input of an e-beam tester;
   applying the synchronizing signal to a synchronizing signal test pad on the device under test;
   in response to said step of applying the test pattern loop to the functional input of said device under test, causing at least one response signal to appear on the device under test;
   directing the e-beam tester to a selected point on the device under test;
   creating a waveform of the response signal appearing on the selected point on the device under test;
   directing the e-beam tester to the synchronizing signal test pad;
   measuring a waveform of the synchronizing signal using the e-beam tester; and
   comparing the waveforms of the synchronizing signal and the test response signal to establish the relationship between the response signal and the trigger.

9. The method of claim 8, wherein said step of measuring a waveform of a response signal comprises the sub-steps of:
   creating a stepped delay between the generation of the trigger and the triggering of the e-beam tester;
   for each step of delay, sampling the signal appearing on the selected point using the e-beam tester; and
   in response to said steps of stepping the delay and sampling, measuring a waveform representing the response signal appearing on the selected point.

10. The method of claim 8, wherein said step of measuring a waveform of the synchronizing signal comprises the sub-steps of:
    creating a step delay between the generation of the trigger and the triggering of the e-beam tester;
    for each step of delay, sampling the synchronizing signal appearing on the synchronizing signal test pad using the e-beam tester; and
    in response to said step of stepping the delay and sampling, measuring a waveform representing the synchronizing signal.

11. The method of claim 8, wherein said step of applying the synchronizing signal to the synchronizing signal test pad comprises the sub-steps of:
    connecting the test pad to a dedicated input of said device under test; and
    applying the synchronizing signal to the synchronizing signal test pad through the dedicated input.

12. The method of claim 8, wherein said step of applying a synchronizing signal to the synchronizing signal test pad comprises the sub-steps of:
- forming a switchable connection between a selected functional input of the device under test and the synchronizing signal test pad;
- switching the selected input to the synchronizing signal test pad; and
- applying the synchronizing signal to the synchronizing signal test pad through the switchable connection.

13. The method of claim 12, wherein said switchable connection is formed by the functional circuitry of the device under test.

14. The method of claim 10, and further comprising the steps of:
- comparing the trigger with the waveform of the synchronizing signal;
- calculating the insertion delay between the trigger and the waveform of the synchronizing signal; and
- in response to said step of comparing and calculating, compensating for insertion delay by varying the step delay.

15. The method of claim 14, wherein said steps of comparing, calculating and compensating are automatically performed by a controller.

16. Apparatus for synchronizing the time scales of a test device driver and an e-beam tester, comprising:
- a device under test, said device under test having a plurality of functional inputs and a synchronizing signal test pad;
- an e-beam tester for forming waveforms of response signals appearing on said device under test and on said synchronizing signal test pad, said e-beam tester having a trigger input;
- variable delay circuitry having a trigger input and operable to step the delay of a trigger being passed from an input of said delay circuitry to said trigger input of said e-beam tester; and
- a test device driver for applying a test pattern to said functional inputs of said device under test, for applying a synchronizing signal to said synchronizing signal test pad, and for applying said trigger to said input of said delay circuitry, such that the time relationship between said trigger input as applied to the e-beam tester and said waveforms of said response signals may be ascertained.

17. The apparatus of claim 16, wherein said synchronizing signal test pad is connected to said test pattern generator through a dedicated input of said device under test.

18. The apparatus of claim 16, wherein said synchronizing signal test pad is switchably connected to one of said functional inputs of said device under test.

19. The apparatus of claim 16, wherein said switchable connection is provided through functional circuitry of said device under test.

20. The apparatus of claim 16, and further comprising a controller operable to receive a waveform of said synchronizing signal from an output of said e-beam tester and to automatically calculate the time relationship between said waveform of said synchronizing signal and said trigger.

21. The apparatus of claim 20, wherein said controller is further operable to pass a signal to a control input of said variable delay circuitry such as to vary the time relationship between said waveforms of said response signals and said synchronizing signal on the one hand, and said trigger input on the other.

* * * * *